United States Patent [19]

Duke et al.

[11] Patent Number: 5,108,562
[45] Date of Patent: Apr. 28, 1992

[54] ELECTROLYTIC METHOD FOR FORMING VIAS AND THROUGH HOLES IN COPPER-INVAR-COPPER CORE STRUCTURES

[75] Inventors: Peter J. Duke, Endwell; Leann G. Keim, Endicott; Krystyna W. Semkow, Johnson City, all of N.Y.

[73] Assignee: International Business Machines, Armonk, N.Y.

[21] Appl. No.: 651,175

[22] Filed: Feb. 6, 1991

[51] Int. Cl.⁵ .............................................. C25F 3/03
[52] U.S. Cl. .......................... 204/129.65; 204/129.75
[58] Field of Search ...................... 204/129.65, 129.75

[56] References Cited

U.S. PATENT DOCUMENTS 4,543,153 9/1985 Nelson ............................ 204/129.65

Primary Examiner—T. M. Tufariello
Attorney, Agent, or Firm—Richard M. Goldman

[57] ABSTRACT

Disclosed is a method of fabricating a microelectronic package having least one layer formed of a Cu-Invar-Cu core encapsulated between a pair of dielectric films. The package is intended to carry surface circuitization on an external surface, with internal circuitization from the surface circuitization passing through the core. The method includes contacting the copper within the Cu-Invar-Cu core with a copper etching aqueous solution of a strong base and a strong oxidizing acid, while maintaining the copper anodic. This electrolytically converts the copper to soluble copper oxides. In a separate step the Invar of the Cu-Invar-Cu core is electrolytically etched with an Invar etching aqueous solution of sodium chloride. This step is carried out under conditions to electrolytically form soluble iron and nickel chlorides while passivating the copper.

13 Claims, 2 Drawing Sheets

ELECTROLYTIC METHOD FOR FORMING VIAS AND THROUGH HOLES IN COPPER-INVAR-COPPER CORE STRUCTURES

FIELD OF THE INVENTION

The invention relates to the fabrication of metal core microelectronic circuit packages. More particularly the invention relates to chemical etching of vias and through holes in microelectronic circuit packages having Cu-Invar-Cu cores.

"Invar" is a registered trademark of Imphy S.A., 168 Rue De Rivoli, Paris, France for an "alloy which is substantially inexpansible," Registration No. 0063970. Invar is an iron-nickel alloy containing approximately sixty four weight percent iron and thirty six weight percent nickel.

Mechanical drilling of the Cu-Invar-Cu core gives rise to imperfections in the exposed Cu-Invar-Cu surfaces. These imperfections result in an improperly shaped via or through hole that is difficult to encapsulate with dielectric.

Chemical etching of vias and through holes requires strong acids, and results in expensive post-treatment and regeneration of the etchant solutions. Moreover, Cu-Invar-Cu can delaminate under strong chemical etching conditions.

According to the disclosed method, etching of vias and through holes in Cu-Invar-Cu metal core microelectronic packages is accomplished in a multi-step electrolytic process with controlled potential. The process eliminates the need for chemical etchant solutions, and allows tailoring of the shape of the vias and through holes in the Cu-Invar-Cu.

BACKGROUND OF THE INVENTION

The general structures and manufacturing processes for electronic packages are described in, for example, Donald P. Seraphim, Ronald Lasky, and Che-Yo Li, *Principles of Electronic Packaging*, McGraw-Hill Book Company, New York, N.Y., (1988), and Rao R. Tummala and Eugene J. Rymaszewski, *Microelectronic Packaging Handbook*, Van Nostrand Reinhold, New York, N.Y. (1988), both of which are hereby incorporated herein by reference.

As described by Seraphim et al., and Tummala et al., an electronic circuit contains many individual electronic circuit components, e.g., thousands or even millions of individual resistors, capacitors, inductors, diodes, and transistors. These individual circuit components are interconnected to form the circuits, and the individual circuits are further interconnected to form functional units. Power and signal distribution are done through these interconnections. The individual functional units require mechanical support and structural protection. The electrical circuits require electrical energy to function, and the removal of thermal energy to remain functional. Microelectronic packages, such as, chips, modules, circuit cards, circuit boards, and combinations thereof, are used to protect, house, cool, and interconnect circuit components and circuits.

Within a single integrated circuit, circuit component to circuit component and circuit to circuit interconnection, heat dissipation, and mechanical protection are provided by an integrated circuit chip. This chip is referred to as the "zeroth" level of packaging, while the chip enclosed within its module is referred to as the first level of packaging.

There is at least one further level of packaging. The second level of packaging is the circuit card. A circuit card performs at least four functions. First, the circuit card is employed because the total required circuit or bit count to perform a desired function exceeds the bit count of the first level package, i.e., the chip. Second, the circuit card provides for signal interconnection with other circuit elements. Third, the second level package, i.e., the circuit card, provides a site for components that are not readily integrated into the first level package, i.e., the chip or module. These components include, e.g., capacitors, precision resistors, inductors, electromechanical switches, optical couplers, and the like. Fourth, the second level package provides for thermal management, i.e., heat dissipation.

Metal core boards are described by Nandakumar G. Aakalu and Frank J. Bolda in "Coated-Metal Packaging", in Rao R. Tummala and Eugene J. Rymaszewski, *Microelectronic Packaging Handbook*, Van Nostrand Reinhold, New York, N.Y. (1988), at pages 923 to 953, specifically incorporated herein by reference.

As used herein, coated metal packages, also referred to as metal core packages, are polymer encapsulated conductive metal cores. Circuitization, that is, personalization, is carried out on the surface of the polymeric encapsulant, with vias and through holes passing through the polymeric encapsulant and the metal core.

The metal core may be a copper core, or a Cu-Invar-Cu core. Copper and Cu-Invar-Cu cores spread out the heat from the devices mounted on the card or board. The high thermal conductivity allows the devices, for example the memory devices or logic devices, to operate at lower temperatures. The metal core also provides high mechanical strength and rigidity to the package. The metal core allows the substrate to carry large and heavy components, and to function in environments where shock, vibration, heat, and survivability are a factor.

Copper-Invar-copper is a particularly desirable core material because of its thermal, electrical, and mechanical properties. Invar is an iron-nickel alloy containing approximately sixty four weight percent iron and thirty six weight percent nickel. While deviations from this composition are possible, the 64-36 alloy has the lowest coefficient of thermal expansion in the iron-nickel binary system, approximately $1.5 \times 10^{-7}$/degree Centigrade.

Lamination of the Invar between copper films of controlled thickness can determine the properties of the Cu-Invar-Cu core. This is shown in Table 1, below, adapted from Nandakumar G. Aakalu and Frank J. Bolda in "Coated-Metal Packaging", in Rao R. Tummala and Eugene J. Rymaszewski, *Microelectronic Packaging Handbook*, Van Nostrand Reinhold, New York, N.Y. (1988), Table 13-2, at page 932.

TABLE 1

| Property | Properties of Copper-Invar-Copper | |
| --- | --- | --- |
| | Cu/In/Cu | Cu/In/Cu |
| % Cu/% Invar/% Cu | 12.5/75/12.5 | 20/60/20 |
| Coefficient of thermal expansion ($\times 10^{-7}$/deg C.) | 44 | 53 |
| Electrical Resistivity (micro-ohm-cm) | 7.0 | 4.3 |
| Young's Modulus ($10^5$ mPa) | 1.4 | 1.35 |
| Enlongation (%) | 2.0 | 2.5 |

TABLE 1-continued

| Property | Properties of Copper-Invar-Copper | |
|---|---|---|
| | Cu/In/Cu | Cu/In/Cu |
| Tensile Strength (mPa) | 380–480 | 310–410 |
| Density (grams/cm$^3$) | 8.33 | 8.43 |
| Thermal Conductivity | | |
| x-y plane | 107 | 160 |
| z plane | 14 | 18 |
| Thermal Diffusivity (cm$^2$/second) | 0.249 | 0.432 |
| Specific Heat (Watts/gm deg C.) | 0.484 | 0.459 |
| Yield Strength | 240–340 | 170–270 |

The polymer may be a perfluorocarbon, a phenolic, an epoxy, or a polyimide. For example, the encapsulant may be a phenolic-fiber composite, exemplified by phenolic and paper. Alternatively, the encapsulant may be an epoxy-fiber composite, illustrated by, for example, epoxy and glass fiber, and epoxy and polyperfluorocarbon fiber. According to a still further alternative, the encapsulant may be a polyimide-fiber composite, such as polyimide and glass fiber, or polyimide and polyperfluorocarbon fiber.

One problem with high density packages, and packages having small diameter vias and through holes is tolerance. For example, in low circuit density applications, where the vias and through holes are on a wide pitch, i.e., about ten or less per square centimeter, and are large diameter, i.e., greater then about 0.8 millimeters in diameter, simple techniques can be used to drill the vias and through holes, and to thereafter avoid shorting the vias and through holes. This is not, however, the case with high density packages having more then ten vias and through holes per square centimeter, or having vias and through holes with diameters smaller then 0.8 millimeters. Thus, where the metal core package contains such small diameter, high density vias and through holes, the vias and through holes are drilled, and thereafter the exposed surfaces of the vias and through holes are sputtered coated with chromium, there remains little dimensional or geometric tolerance for application of a dielectric polymer to be applied after the vias and through holes are so drilled and sputter coated. This dielectric coating is critical because it allows the deposited dielectric polymer to provide the through hole insulation.

Another problem of etching metal core packages is the need for CuCl$_2$/HCl and/or FeCl$_3$/HCl etchants. These particular etchants require complex and expensive post-treatment and disposal processes. Moreover, conventional etching systems result in preferential etching at the Cu-Invar interface, with concomittant Cu "overhang." This Cu "overhang" interferes with the chromium deposition step, and the subsequent application of the conformal dielectric coating.

OBJECTS OF THE INVENTION

It is one object of the invention to provide high density metal core cards and boards.

It is another object of the invention to eliminate the use of such etchants as CuCl$_2$/HCl and FeCl$_3$/HCl.

It is a further object of the invention to eliminate deleterious preferential etching and the resultant difficulties in subsequent processing.

It is a still further object of the invention to etch the Cu/Invar/Cu compensator or core in aqueous solutions of inorganic salts at ambient temperatures.

SUMMARY OF THE INVENTION

These and other objects are obtained by the microelectronic circuit package fabrication method of the invention. The fabrication method is useful for fabricating a metal core microelectronic package having least one layer formed of a Cu-Invar-Cu core encapsulated between a pair of dielectric films. The package is intended to carry surface circuitization on an external surface, with internal circuitization from the surface circuitization passing through the Cu-Invar-Cu core.

The fabrication method is a two step electrolytic method that includes contacting the exposed copper within the Cu-Invar-Cu core with a copper etching aqueous, acidic, solution of a strong base and a strong oxidizing acid, while maintaining the copper anodic. This electrolytically converts the copper to acid soluble copper oxides. In a separate step the Invar of the Cu-Invar-Cu core is electrolytically etched with an Invar etching aqueous solution of sodium chloride. This step is carried out under conditions to electrolytically form soluble iron and nickel chlorides while passivating the copper.

The electrolytic etching steps may be carried out in either sequence. According to one exemplification of the invention, the copper is etched first. This is accomplished by etching the copper in the copper etching solution to form soluble copper oxides, and thereafter etching the Invar in the Invar etching sodium chloride solution to form soluble iron and nickel chlorides while passivating the copper.

According to an alternative exemplification of the invention the Cu-Invar-Cu is etched first, with partial etching of the copper, which leaves a copper overhang. This copper overhang is then subsequently etched back.

THE FIGURES

The invention must be understood by reference to the Figures.

DETAILED DESCRIPTION OF THE INVENTION

The fabrication method is useful for fabricating a metal core microelectronic package having at least one layer formed of a Cu-Invar-Cu core or compensator. The Cu-Invar-Cu core may be encapsulated between a pair of dielectric films. The package is intended to carry surface circuitization on an external surface, with internal circuitization from the surface circuitization passing through the Cu-Invar-Cu core.

The fabrication method is a two step electrolytic method that includes contacting the copper within the etch resist patterned Cu-Invar-Cu core with an aqueous solution of a salt of a strong base and a strong oxidizing acid, while maintaining the copper anodic. This electrolytically converts the copper to acid soluble copper oxides. In a separate step the Invar of the Cu-Invar-Cu core is electrolytically etched with an Invar etching aqueous solution of sodium chloride. This step is carried out under conditions to electrolytically form soluble iron and nickel chlorides while passivating the copper.

Figure 2:
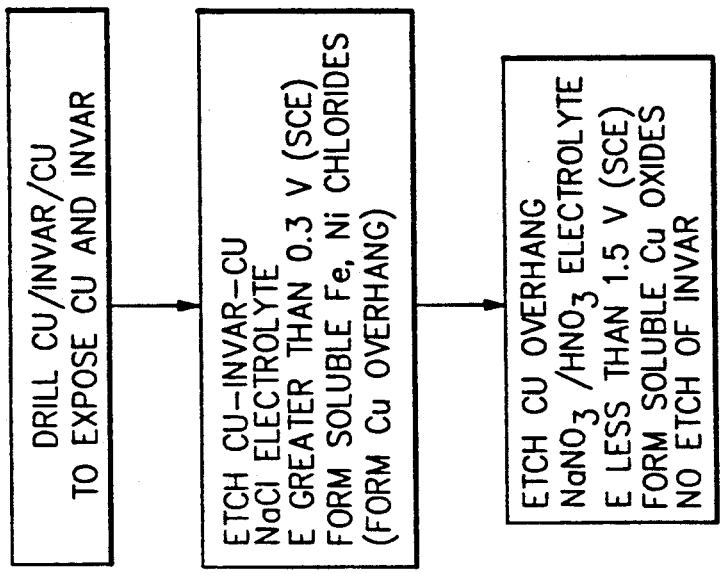
FIG. 2 is a flow chart of an alternative method of the invention.
Figure 1:
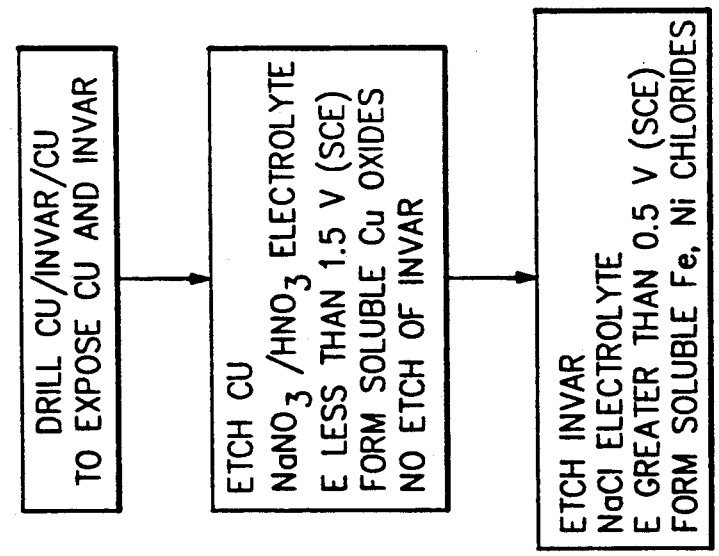
FIG. 1 is a flow chart of one method of the invention.

The method of the invention is illustrated in the flow charts of FIGS. 1 and 2. The FIGURES illustrate a microelectronic circuit package fabrication method useful for fabricating a metal core microelectronic package having at least one layer formed of a Cu-Invar-Cu core.

The electrolytic etching steps may be carried out in either sequence. According to one exemplification of the invention, shown in FIG. 1, the copper is etched first. This is accomplished by etching the copper in the aqueous alkali metal nitrate—nitric acid solution, referred to herein as the copper etching solution, to form acid soluble copper oxides, and thereafter etching the Invar in the aqueous sodium chloride solution, referred to herein as the Invar etching solution to form soluble iron and nickel chlorides while passivating the copper.

While nitrates and nitric acid are referred to herein, it is, of course, to be understood that any salt of a strong acid and a strong base may be used. For example, alkali metal salts (Li, Na, K, or combinations thereof) of sulfates, or phosphates may be utilized in the method of the invention.

According to this exemplification of the invention the copper/Invar/copper plane, for example a Cu-Invar-Cu plane consisting of 0.125 mil Cu laminated to both sides of a 0.75 mil thick sheet of Invar is patterned on both sides by the etch resist process. The process is a two step process where the Cu-Invar-Cu is sequentially immersed in aqueous solutions of inorganic salts, and an electrolytic potential is applied to the Cu-Invar-Cu to etch the copper, and then to etch the Invar.

In the process shown in FIG. 1 the copper is etched first. The Cu-Invar-Cu is immersed in an aqueous solution of an alkali metal nitrate and nitric acid. The solution is typically from 5 Molar alkali metal nitrate to saturated alkali metal nitrate, containing an effective amount of nitric acid, $HNO_3$. An effective amount of nitric acid is an amount sufficient to aid in the dissolution of the electrolytic copper oxides, leaving the Invar substantially unattacked. The alkali metal nitrate may be $KNO_3$ or $NaNO_3$.

The copper is maintained anodic with respect to a counter electrode, at a potential of less then 1.5 volts versus a Saturated Calomel Electrode (SCE). In the case of an etching solution containing saturated $NaNO_3$ and 0.5 volume percent $HNO_3$, approximately 60 seconds at 1.3 Volts (SCE) is required to etch through 0.125 mil copper.

Thereafter the Cu-Invar-Cu compensator is immersed in an aqueous sodium chloride solution. The Invar, which was unattacked by the nitrate/nitric acid solution, is preferentially etched by the sodium chloride solution. This is because highly soluble iron chlorides and nickel chlorides are formed, and the copper is passivated by the formation of a relatively insoluble copper chloride film.

The oxidation of the Invar to iron chlorides and nickel chlorides takes place at an applied voltage higher then 0.5 volts to enhance the etch rate of Invar with respect to that of Cu. In saturated NaCl, at 1.5 volts (SCE), approximately 65 seconds is required to etch through 0.75 mils of Invar.

According to an alternative exemplification of the invention the entire Cu-Invar-Cu body is etched first, with partial etching of the copper, and the formation of a copper overhang. The copper overhang is then subsequently etched back. In this alternative process shown in FIG. 2 the Cu-Invar-Cu is etched first, with preferential etching of the Invar, and formation of Cu overhang. The Cu-Invar-Cu is immersed in an aqueous solution of an alkali metal chloride, as sodium chloride, at a voltage of at least about 0.3 volts (SCE).

In the case of 0.125 mil Cu- 0.75 mil Invar- 0.125 mil Cu, at an applied potential 0.75 volts, approximately 80 seconds is required to etch through the Cu-Invar-Cu. This creates an "overhang" of copper over the Invar.

The copper overhang is removed by selective etchback of the copper in an alkali metal nitrate-nitric acid solution. The solution is typically from 5 Molar alkali metal nitrate to saturated alkali metal nitrate, containing an effective amount of nitric acid, $HNO_3$. An effective amount of nitric acid is an amount sufficient to aid in the dissolution of the electrolytic copper oxides, leaving the Invar substantially unattacked. The alkali metal nitrate may be $KNO_3$ or $NaNO_3$.

For etch back of the Cu overhang, the copper is maintained anodic with respect to a counter electrode, at a potential of less then 1.5 volts versus a Saturated Calomel Electrode (SCE). In the case of an etching solution containing saturated $NaNO_3$ and 0.5 volume percent $HNO_3$, approximately 20 seconds at 1.3 Volts (SCE) is required to etchback the overhang from 0.125 mil copper.

The potential on the exposed Cu-Invar-Cu may be continuous d.c., or it may be pulsed d.c.

According to a particularly preferred exemplification of the invention increased electrolyte contact and diffusivity may be provided by ultrasonically agitating the electrolyte.

According to a still further embodiment of the invention, the Cu-Invar-Cu compensator may be maintained anodic at a potential above about 1.5 volts in an alkali metal nitrate/nitric acid solution. Electrolytic etching may be carried out with some oxygen evolution on the Invar. The potential is such that the dissolution rate for copper is slightly higher then the dissolution rate for Invar, thereby providing a profiled etch, substantially free of overhang.

Figure 3:
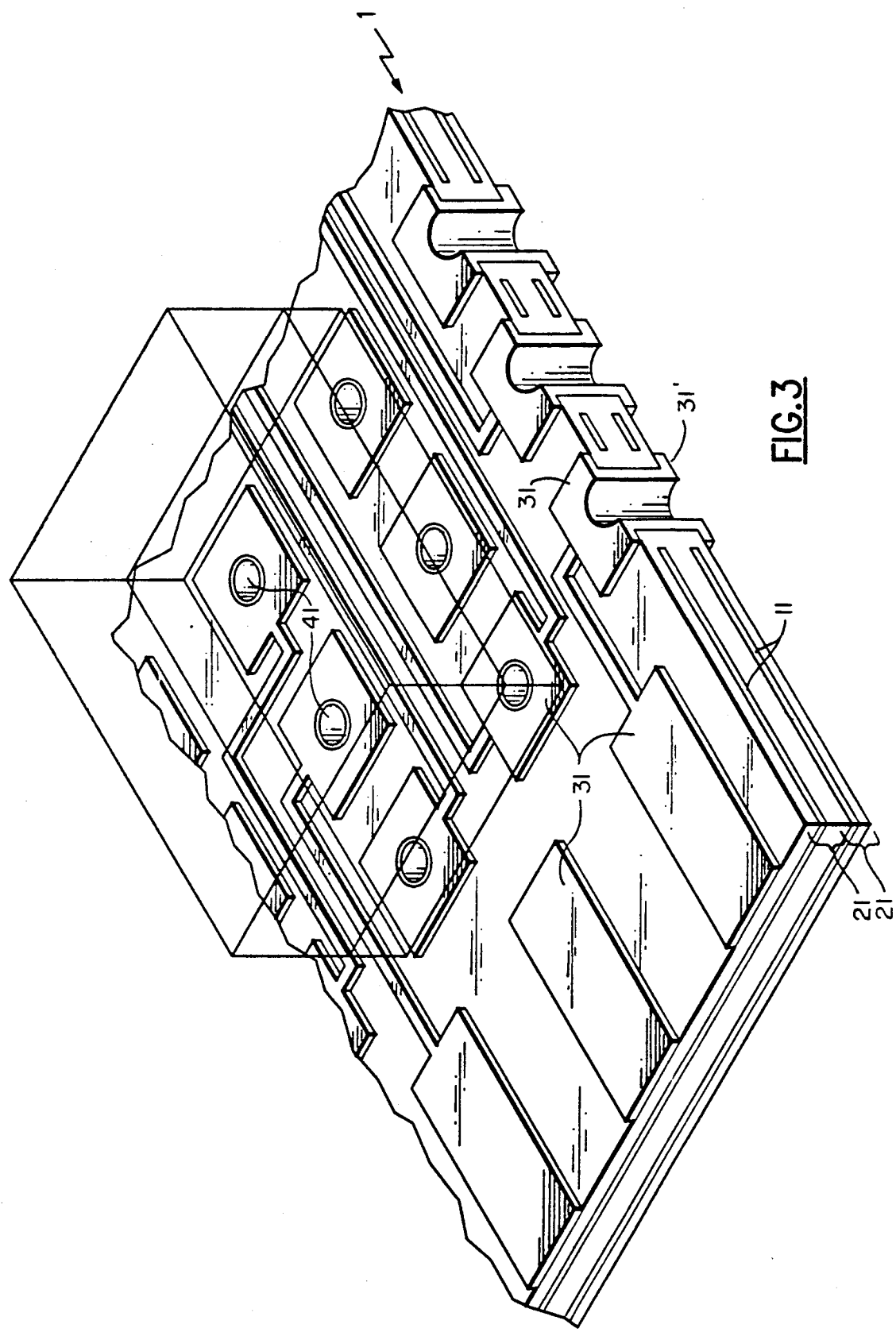
FIG. 3 is a perspective, partial cutaway view of a metal core package produced according to the method of the invention.

A high density metal core package prepared by a method of the invention is shown in FIG. 3. The metal core circuit package 1 has a metal core 11 encapsulated by a pair of polymeric layers 21. The polymeric layers carry surface circuitization 31 including through holes 41. The through holes are characterized by dielectric coverage that allows high surface circuitization densities, i.e., ten or more vias and/or through holes per square centimeter, plated through hole diameters and via diameters of less then 0.8 millimeters, and especially plated through hole diameters and via diameters and capable of accommodating high wiring density surface circuitization, e.g. corresponding to surface circuitization line widths of 0.25 millimeters and less, with concomittant surface circuitization density.

To be noted is that the metal core package 1 shown in the FIGURE is a two sided metal core circuit package having plated through holes connecting the surface circuitization, 31, 31', on both sides of the package, 1, without shorting the metal core, 11.

Thus, according to the method of the invention it is possible to fabricate high density metal core cards and boards, without the use of such etchants as $CuCl_2$/HCl and $FeCl_3$/HCl. Moreover, the method of the invention results in the elimination of deleterious preferential etching and the resultant difficulties in subsequent processing. These advantages are obtained when etching the Cu/Invar/Cu compensator in aqueous solutions of inorganic salts at ambient temperatures.

The invention may be further understood and illustrated by reference to the following examples.

EXAMPLES

EXAMPLE 1

A 1 mil Cu-Invar-Cu compensator (0.125 mil Cu, 0.75 mil Invar, 0.125 mil Cu) was patterned with etch resist into 6.5 mil vias on 10 mil centers. The compensator was etched in ambient, aqueous, saturated $NaNO_3$ containing 0.5 volume percent $HNO_3$ at 1.3 volts (SCE) for 60 seconds. Thereafter, the partially etched compensator was removed from the nitrate etchant, and immersed in saturated, ambient, aqueous NaCl at 1.5 volts (SCE) for 65 seconds. A satisfactory shaped compensator via was obtained.

EXAMPLE 2

A 1 mil Cu-Invar-Cu compensator (0.125 mil Cu, 0.75 mil Invar, 0.125 mil Cu) was patterned with etch resist into 6.5 mil vias on 10 mil centers. The compensator was etched in ambient, aqueous, saturated NaCl at 0.75 volts (SCE) for 80 seconds. Thereafter the partially etched compensator was removed from the NaCl solution and immersed in ambient, aqueous, 5 Molar $NaNO_3$ containing 0.5 volume percent $HNO_3$ at 1.3 volts (SCE) for 20 seconds to remove the Cu overhand.

EXAMPLE 3

A 1 mil Cu-Invar-Cu compensator (0.125 mil Cu, 0.75 mil Invar, 0.125 mil Cu) was patterned with etch resist into 5.0 mil vias on 20 mil centers. The compensator was etched in ambient, aqueous, 5 Molar $NaNO_3$ containing 0.5 volume percent $HNO_3$ at 10 volts (SCE).

While the invention has been described with respect to certain preferred embodiments and exemplifications, it is not intended to limit the scope of the invention thereby, but solely by the claims appended hereto.

We claim:

1. A method of fabricating a microelectronic package, said package adapted to carry surface circuitization on an external surface thereof and comprising at least one Cu-Invar-Cu core with internal circuitization from said surface circuitization passing therethrough, said method comprising:
   a. contacting copper of said Cu-Invar-Cu core with a copper etching aqueous solution of a strong base and a strong oxidizing acid and maintaining said copper anodic to electrolytically form soluble copper oxide; and
   b. contacting Invar of said Cu-Invar-Cu core with an Invar etching aqueous solution, of sodium chloride and maintaining said Invar anodic to electrolytically form soluble iron and nickel chlorides while passivating said copper.

2. The method of claim 1 wherein said strong base is an alkali metal hydroxide and said strong oxidizing acid is chosen from the group consisting of oxygen acids of phosphorous, nitrogen, and sulfur.

3. The method of claim 2 wherein said alkali metal hydroxide is sodium hydroxide, and said oxidizing acid is nitric acid.

4. The method of claim 3 wherein the copper etching solution is at least about 0.5 molar in sodium nitrate.

5. The method of claim 4 wherein the copper etching solution is an acidic solution and further contains an excess of $NO^{31}{}_3$ ion with respect to $Na^+$ ion.

6. The method of claim 1 wherein said Invar etching aqueous sodium chloride solution is at least about 0.5 molar in sodium chloride.

7. The method of claim 1 comprising first etching the copper in the copper etching solution to form soluble copper oxides, and thereafter etching the Invar in the Invar etching sodium chloride solution to form soluble iron and nickel chlorides while passivating the copper.

8. The method of claim 7 maintaining the copper anodic in the copper etching solution at a potential to form soluble copper oxides.

9. The method of claim 7 maintaining the copper anodic in the copper etching solution at a voltage of less then 1.5 volts versus a Saturated Calomel Electrode.

10. The method of claim 7 comprising thereafter maintaining the copper and Invar anodic in the Invar etching chloride at a potential sufficient to form soluble chlorides of iron and nickel while passivating the copper.

11. The method of claim 7 comprising thereafter maintaining the copper and Invar anodic in the sodium chloride at a potential greater then 0.5 volts versus a Saturated Calomel Electrode to form soluble chlorides of iron and nickel while passivating the copper.

12. The method of claim 1 comprising first etching the Cu-Invar-Cu in the sodium chloride solution to form soluble iron and nickel chlorides and partially etching the copper, and thereafter etching the copper in the copper etching solution.

13. The method of claim 12 comprising first etching the Cu-Invar-Cu in aqueous sodium chloride at a potential of at least about 0.3 volts versus a Saturated Calomel Electrode, and thereafter etching the copper in the aqueous copper etching solution.

* * * * *